United States Patent [19]

Kato

[11] Patent Number: 4,633,583

[45] Date of Patent: Jan. 6, 1987

[54] METHOD OF MAKING A LEAD FRAME FOR INTEGRATED CIRCUITS

[75] Inventor: Yoshihisa Kato, Kokubunji, Japan

[73] Assignee: Sumitomo Metal Mining Company Limited, Tokyo, Japan

[21] Appl. No.: 664,968

[22] Filed: Oct. 26, 1984

Related U.S. Application Data

[62] Division of Ser. No. 425,102, Sep. 27, 1982, Pat. No. 4,523,218.

[30] Foreign Application Priority Data

Sep. 29, 1981 [JP] Japan .................... 56-154653

[51] Int. Cl.⁴ ............................................ H01R 43/00
[52] U.S. Cl. .......................................... 29/827; 357/70
[58] Field of Search ............................ 357/70; 29/827

[56] References Cited

U.S. PATENT DOCUMENTS 4,415,917 11/1983 Chiba et al. .................. 29/827 X
4,486,948 12/1984 Chiba et al. ....................... 29/827

FOREIGN PATENT DOCUMENTS 145349 9/1982 Japan ...................... 357/70

Primary Examiner—Howard N. Goldberg
Assistant Examiner—Carl J. Arbes
Attorney, Agent, or Firm—Watson, Cole, Grindle & Watson

[57] ABSTRACT

A lead frame for integrated circuits has a central opening in which there is fitted a metal piece having alternate recesses and projections, the recesses fitting over inner ends of leads of the lead frame and the projections fitting in gaps between the inner lead ends. The metal piece includes slots and cut-outs to allow its comb-shaped members to bend independently of each other. After the lead frame has been fused to a ceramic substrate, the metal piece can be removed by being pulled upwardly with a relatively small force applied. The metal piece has a pair of pull tabs. For fabricating such a lead frame, the metal piece is stamped out of an integral metal plate structure having the leads and support frame integral with the leads. Then, the stamped metal piece is pushed back so as to fit with the leads of the lead frame.

1 Claim, 7 Drawing Figures

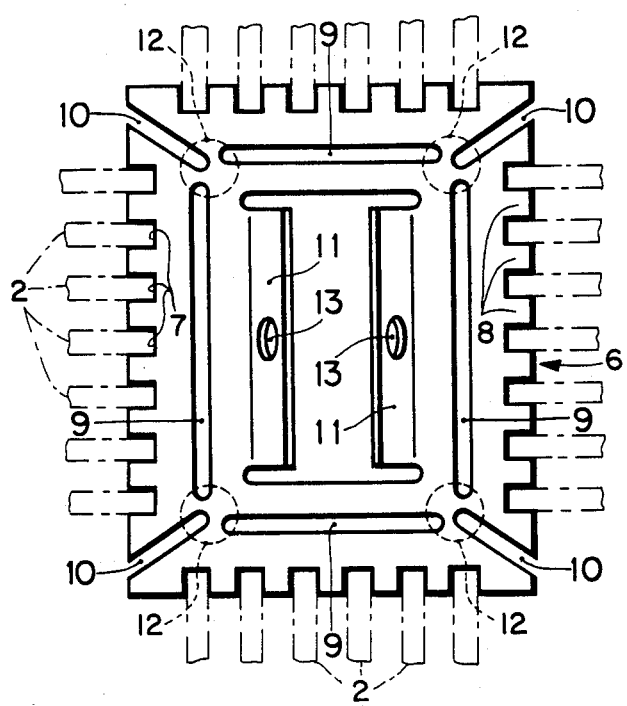
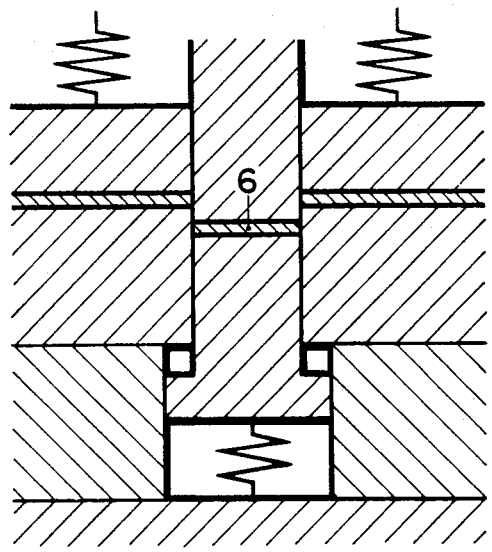
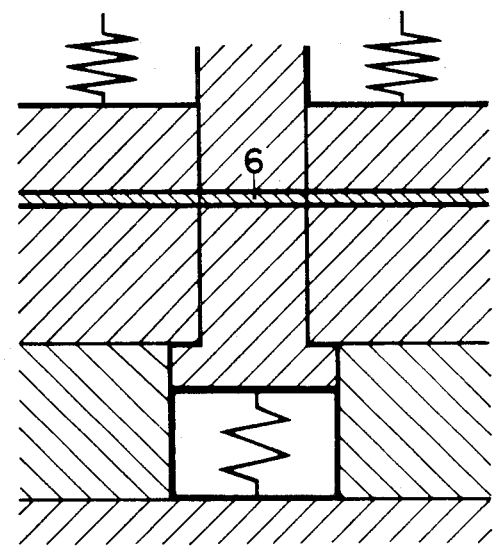
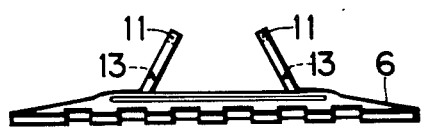

METHOD OF MAKING A LEAD FRAME FOR INTEGRATED CIRCUITS

This application is a divisional application of application Ser. No. 425,102, filed Sept. 27, 1982, now U.S. Pat. No. 4,523,218.

BACKGROUND OF THE INVENTION

The present invention relates to an improved construction of a lead frame for integrated circuits (IC) and a method of fabricating such the lead frame.

A lead frame for use in a glass-encapsulated IC package has a central opening and a multiplicity of leads with free inner ends. Since the inner ends are not securely supported, they tend to bend upwardly or downwardly, or laterally. The bent lead ends cannot be bonded sufficiently to a ceramic substrate coated with glass, or securely bonded to aluminum wires.

One known proposal to eliminate the above difficulties is described in U.S. Pat. No. 4,137,546 to Frusco. The disclosed lead frame has a plurality of break-off tabs integral with the inner lead ends. The break-off tabs are severed off the inner lead ends after the leads have been bonded to the substrate. However, the inner lead ends can still be bent since the break-off tabs are independently movable. Removal of the break-off tabs cannot be mechanized since they will be cut off by being bent up and down several times.

SUMMARY OF THE INVENTION

It is an object of the present invention to provide a lead frame construction having all inner lead ends which remain completely supported until they are bonded to a glass-coated ceramic substrate and which are releasable of such support in a single operation after they have been bonded to the ceramic substrate.

Another object of the present invention is to provide a method of fabricating such a lead frame construction.

According to the present invention, a lead frame for use in an IC package has a multiplicity of leads extending outwardly from a central opening and having inner and outer ends, and a support frame integrally supporting the outer ends of the leads. A metal piece is disposed in the central opening and has in peripheral edges thereof alternate recesses and projections, the recesses fitting over the inner ends and the projections fitting in gaps between the inner ends. The metal piece also has slots spaced inwardly from the recesses and projections and cut-outs defined between the slots. The slots and the cut-outs jointly divide the metal piece into a plurality of comb-shaped members interconnected by a plurality of bendable portions defined therebetween by the slots and the cut-outs, the comb-shaped members being independently bendable.

To fabricate the lead frame, a metal plate structure is prepared which has a portion to be severed later as the metal piece, a multiplicity of leads extending outwardly from such portion, and a support frame integral with outer ends of the leads. The portion is stamped as the metal piece out of the metal plate structure to allow all of inner ends of the leads to project independently of each other, the stamped portion having alternate recesses and projections in its peripheral edges. The stamped metal piece is pushed back until the recesses fit over the inner ends of the leads and the projections fit in gaps between the inner ends of the leads.

The above and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 3(A) is an enlarged scale plan view of a metal piece to be mounted in the lead frame shown in FIG. 2;

FIG. 3(B) is a front elevational view of the metal piece illustrated in FIG. 3(A);

FIG. 4 is a front elevational view of the metal piece of FIG. 3(A) as it is pulled;

FIGS. 5(A) and 5(B) are cross-sectional views illustrative of a push-back step in a lead frame stamping operation.

DETAILED DESCRIPTION

Figure 1:
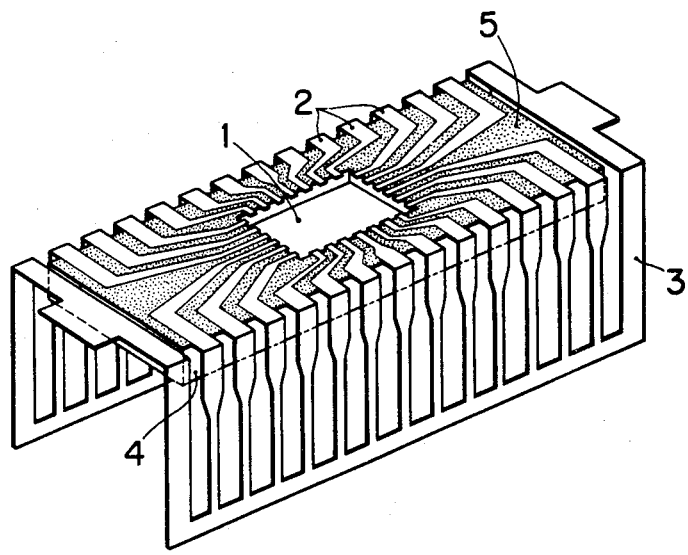
FIG. 1 is a perspective view of a conventional lead frame for use in a dual-in-line ceramic package.

FIG. 1 shows a known lead frame for use in a ceramic package comprising a semiconductor integrated circuits device (hereinafter referred to as an "IC chip") mounted on a ceramic substrate. The lead frame has a central opening 1 and includes a multiplicity of leads 2 extending outwardly from the central opening 1 and integral with a support frame 3. The lead frame is used for a dual-in-line ceramic package (hereinafter referred to as a "Cer-Dip") and is fabricated by stamping a web of Fe-Ni alloy coated with strips of aluminum (not shown) on progressive dies, and bending outer lead end portions away from the aluminum-coated surface into a channel shape.

The Cer-Dip is assembled as follows: A ceramic substrate 4 having a layer of gold on its surface portion positionally corresponding to the central opening 1 in the lead frame and a glass layer 5 of a low melting point which covers the upper surface of the ceramic substrate 4 are bonded to each other by heating, the IC chip is fixed to the gold layer in the central opening 1, and then aluminum wires are bonded to the IC chip and to the leads 2. Thereafter, a cover (not shown) identical in shape with the ceramic substrate 4 and having a glass layer of a low melting point on its surface for contact with the lead frame, is placed on the lead frame and heated. The lead frame is now sandwiched and hermetically sealed with heat between the ceramic substrate 4 and the cover. Finally, the support frame 3 of the lead frame is cut off to complete the Cer-Dip.

With the lead frame of this configuration, the leads 2 are supported at their outer ends by the support frame 3 but not supported at their inner ends. The inner lead ends are thus apt to bend upwardly or downwardly, or laterally during shipment or while the lead frame is being bonded to the ceramic substrate 4. When the inner lead ends are turned upwardly, they cannot be fused in position by the glass layer 5. When the inner lead ends are bent laterally, they may be brought into mutual contact resulting in bonding failure or malfunctions of the completed semiconductor device.

The inner lead ends are apt to bend more frequently the more leads there are and as the leads become narrower and longer. One proposal to reduce such a disadvantage is disclosed in the aforementioned U.S. Pat. No. 4,137,546 to Frusco in which tabs supporting inner ends of a plurality of leads can be broken off. With this construction, there is no problem for the inner lead ends to be deformed before the leads are fused to the ceramic substrate and hence the leads are less subjected to unwanted bending.

However, the prior arrangement is disadvantageous in that the break-off tabs, two to four in number, may each cause bending of all of the lead ends connected thereto. The break-off tabs are severed from the lead ends by being bent up and down several times, a procedure which is difficult to mechanize.

The present invention will now be described in detail with reference to the drawings.

Figure 2:
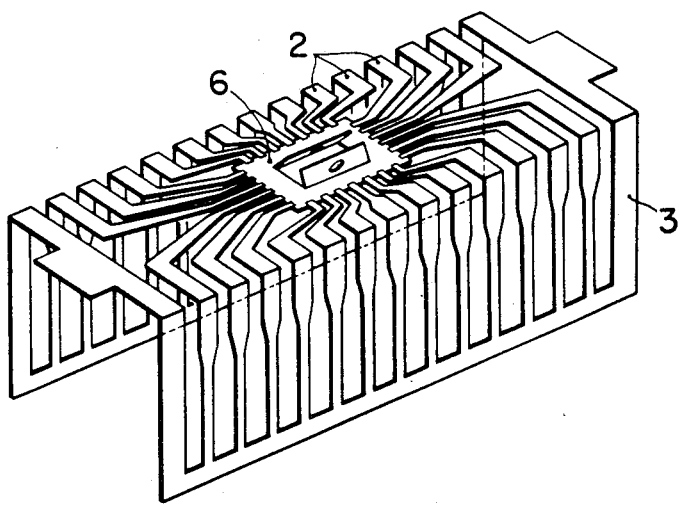
FIG. 2 is a perspective view of a lead frame according to the present invention.

FIG. 2 shows a lead frame according to the present invention. The lead frame of FIG. 2 includes a metal piece 6 fitted in the central opening 1 in the lead frame as shown in FIG. 1 with the inner ends of the leads 2 being fastened temporarily to the metal piece 6.

FIGS. 3(A) and 3(B) illustrate the metal piece 6 on an enlarged scale. The metal piece 6 has alternate recesses 7 and projections 8 in its peripheral edges. The recesses 7 serve to receive the inner ends of the leads 2 and the projections 8 serve to extend into gaps between the adjacent inner lead ends. The metal piece 6 also has slots 9 extending parallel to the peripheral edges thereof and inwardly of the recesses 7 and projections 8, and cutouts 10 defined respectively in the four corners of the metal piece 6 and extending substantially in diagonal directions of the metal piece 6, thus providing four comb-shaped members. A pair of opposite pull tabs 11 are bent from a central portion of the metal piece 6 and arranged symmetrically with respect to a center line of the metal piece 6.

When the pull tabs 11 are pulled upwardly, the stresses are concentrated on four bendable portions 12 defined between the slots 9 and the cut-outs 10 to bend the bendable portions 12 with the four comb-shaped members being independently of each other as shown in FIG. 4. Thus, the metal piece 6 can smoothly be removed. If there were no slots 9 and cut-outs 10, it would require an undue force to remove the metal piece 6 tending to break the glass layer 5 as shown in FIG. 1 or raising the leads 2 off the glass layer 5. For example, with a metal piece for use in a lead frame having 40 leads, a force of about 10 Kg was needed to remove the metal piece when the metal piece had no slots 9 and cut-outs 10. When the metal piece had slots 9 and cut-outs 10, the metal piece could be removed with a force of about 4 Kg applied. If, however, the metal piece could be removed with too small a force, then the metal piece would come off when subjected to a small shock. To cope with this problem, the depth of the recesses 7 defined in the peripheral edges of the metal piece 6 may be changed to adjust the force with which the metal piece 6 is supported or can be removed. The depth of the recesses 7 should preferably be 0.1 to 4 times the width of the inner ends of the leads 2, and should more preferably be 0.5 to 1 times that width. The slots 9 should be spaced from the recesses 7 by a distance which is two or more times the thickness of the metal piece 6. The slots 9 and cut-outs 10 should have a width that is about 0.5 to 1.5 times the thickness of the metal piece 6. The ends of the adjacent slots across each bendable portion 12 should be spaced from each other a distance which is substantially equal to the thickness of the metal piece 6. The pull tabs 11 may be of any desired shape provided they can be pulled upwardly. The pull tabs 11 as shown in FIG. 3 have aligned central holes 13, respectively, through which a rod or the like can be inserted to lift the metal piece 6. Thus, removal of the metal piece 3 can easily be mechanized.

The lead frame having such a metal piece 6 can easily be fabricated by stamping. More specifically, a sheet of metal is etched and stamped to form an integral metal plate structure including the metal piece 6, the leads 2 and the support frame 3. The metal plate structure is stamped to define the pull tabs 11, the slots 9 and cutouts 10. Then, the metal piece 6 is stamped out of the metal plate structure so as to allow all of inner ends of the leads 2 to project independently of each other. The stamped metal piece 6 is then "pushed back" to cause the recesses 7 and the projections 8 to fit over the inner lead ends and in the gaps therebetween. The above fabrication procedure can easily be carried out in a pressing operation using progressive dies.

As shown in FIGS. 5(A) and 5(B), the metal piece 6 is first stamped out of the metal plate structure (FIG. 5(A)) and then pushed back to its original position (FIG. 5(B)), a process which is known in the field of stamping operation. The pull tabs 11 should preferably be bent upwardly after the metal piece 6 has been pushed back.

A lead frame for use in the Cer-Dip can normally be stamped out of a metal web on progressive dies. The lead frame according to the present invention can be fabricated on such progressive dies with the above push-back step added.

While the present invention has been described as being applied to lead frames for use in the Cer-Dip, the invention is not limited to such an application. For example, the present invention is applicable to a lead frame for a flat package having outer lead end portions extending flatwise or not bent in a channel shape, or to such a lead frame which has inner lead ends plated with gold, silver or the like. The inner lead ends may be shaped in a variety of configurations such as rectangular, triangular, or semicircular forms.

With the arrangement of the present invention, highly reliable packages in which a ceramic substrate and a lead frame are bonded with glass can be fabricated with an improved rate of yield.

Although a specific preferred embodiment has been shown and described, it should be understood that many alterations and modifications may be made therein without departing from the scope of the appended claims.

What is claimed is:

1. A method of fabricating a lead frame for use in an integrated circuit package, comprising the steps of:
   preparing an integral metal plate structure which includes a support frame, a central section, a multiplicity of spaced lead elements extending between said central section and said frame, the outer ends of said lead elements being integrally connected with said frame and the inner ends of said lead elements being integrally connected with said central section along its periphery, said central section having slots spaced inwardly of said periphery and cutouts defined between said slots;
   severing a portion of said central section from said lead elements to provide a metal piece whose periphery includes alternate recesses and projections, said recesses being formed at locations where the inner ends of said lead elements were previously connected to said central section, said slots and said cutouts jointly dividing said metal piece into a plurality of comb-shaped members interconnected by a plurality of bendable portions defined therebetween by said slots and said cutouts, said comb-shaped members being independently bendable;

moving said metal piece in a first direction with respect to said lead frame so as to separate the recesses in the periphery of said metal piece from the extended tips of said lead elements; and moving said metal piece in a second direction opposite said first direction so as to reposition the recesses in the periphery of said metal piece around the respective extended tips of the lead elements.

* * * * *